United States Patent
DeRyckere et al.

(10) Patent No.: US 6,486,723 B1
(45) Date of Patent: Nov. 26, 2002

(54) PROGRAMMABLE DIFFERENTIAL DELAY CIRCUIT WITH FINE DELAY ADJUSTMENT

(75) Inventors: John F. DeRyckere, Eau Claire, WI (US); Philip Nord Jenkins, Eau Claire, WI (US); Frank Nolan Cornett, Chippewa Falls, WI (US)

(73) Assignee: Silicon Graphics, Inc., Mountain View, CA (US)

(*) Notice: Subject to any disclaimer, the term of this patent is extended or adjusted under 35 U.S.C. 154(b) by 0 days.

(21) Appl. No.: 10/142,472

(22) Filed: May 9, 2002

Related U.S. Application Data

(62) Division of application No. 09/475,466, filed on Dec. 30, 1999, now Pat. No. 6,417,713.

(51) Int. Cl.$^7$ ............................................. H03H 11/26
(52) U.S. Cl. ..................... 327/271; 327/276; 327/327; 327/565
(58) Field of Search ................................ 327/271, 276, 327/277, 284, 153, 158, 392, 393, 98, 280, 565; 375/220, 288

(56) References Cited

U.S. PATENT DOCUMENTS 6,127,872 A * 10/2000 Kumata ..................... 327/276
6,294,937 B1 * 9/2001 Crafts et al. ............... 327/158
6,417,713 B1 * 7/2002 DeRyckere et al. ......... 327/271

* cited by examiner

Primary Examiner—Timothy P. Callahan
Assistant Examiner—Linh Nguyen
(74) Attorney, Agent, or Firm—Schwegman, Lundberg, Woessner & Kluth, P.A.

(57) ABSTRACT

Circuitry that provides additional delay to early arriving signals such that all data signals arrive at a receiving latch with same path delay. The delay of a forwarded clock reference is also controlled such that the capturing clock edge will be optimally positioned near quadrature (depending on latch setup/hold requirements). The circuitry continuously adapts to data and clock path delay changes and digital filtering of phase measurements reduce errors brought on by jittering data edges. The circuitry utilizes only the minimum amount of delay necessary to achieve objective thereby limiting any unintended jitter. Particularly, this programmable differential delay circuit with fine delay adjustment is designed to allow the skew between ASICS to be minimized. This includes skew between data bits, between data bits and clocks as well as minimizing the overall skew in a channel between ASICS.

7 Claims, 12 Drawing Sheets

PROGRAMMABLE DIFFERENTIAL DELAY CIRCUIT WITH FINE DELAY ADJUSTMENT

This application is Divisional of U.S. application Ser. No. 09/475,466, filed Dec. 30, 1999 now U.S. Pat. No. 6,417,713.

TECHNICAL FIELD OF THE INVENTION

The present invention relates generally to signaling between electrical components and in particular the present invention relates to a mechanism to provide high resolution of signals transmitted in electrical systems.

BACKGROUND OF THE INVENTION

In modern computer systems, signals from a common source may be distributed for controlling many widely separated circuit modules. The time delays associated with passage of a signal through parallel paths are not uniform; often, they arrive in skewed time relation to each other. Similarly, data transferred in parallel will often arrived skewed from adjacent data signals, or from an accompanying clock signal. Often, an attempt is made to correct the skew it by adding a finite time delay to the signal.

Within a computer system, data is passed from register to register, with varying amounts of processing performed between registers. Registers store data present at their inputs either at a system clock transition or during a particular phase of the system clock. Skew in the system clock signal impacts register-to-register transfers, i.e., it may cause a register to store data either before it has become valid or after it is no longer valid.

As system clock periods shrink there is increasing pressure on the computer architect to increase determinism in the system design. Clock skew, like setup time, hold time and propagation delay, increase the amount of time that data is in an indeterminable state. System designers must be careful that this indeterminable state does not fall within the sampling window of a register in order to preserve data integrity.

It is possible to minimize a limited amount of signal skew by applying careful attention to the layout and design of the circuit topography. Application of design rules to reduce skew becomes less effective as the clock period shrinks and the distance a signal must travel increases (at least with respect to the clock period). Many steps are only effective for the chips themselves and oftentimes cannot address skew from various divergent clock pulse path interconnections. In addition, such skew compensations, once implemented, oftentimes cannot accommodate introduction of subsequent increments of skew as from component aging, operating environment variations, and so forth.

For the reasons stated above, and for other reasons stated below which will become apparent to those skilled in the art upon reading and understanding the present specification, there is a need in the art for a system and method of reducing skew between two or more signal lines.

SUMMARY OF THE INVENTION

The above mentioned problems are addressed by the present invention and will be understood by reading and studying the following specification.

In one embodiment of the present invention, a delay line for adding delay to a signal is presented. The delay line includes a number of delay elements, including a first and a second delay element. The delay line further includes a multiplexer connected to each of the multiple of delay elements. According to the present invention the second delay element adds a predetermined delay to the signal and the first delay element operates with the multiplexer to selectively add a second predetermined delay to the signal.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
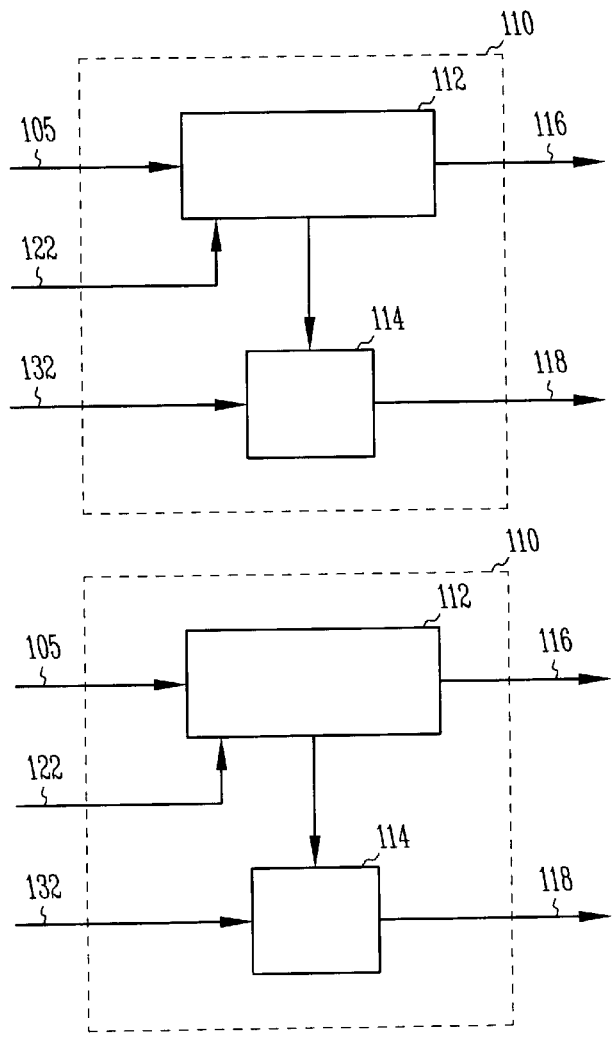
FIG. 1 is a schematic illustration of a delay line according to the teachings of this application.
Figure 1:
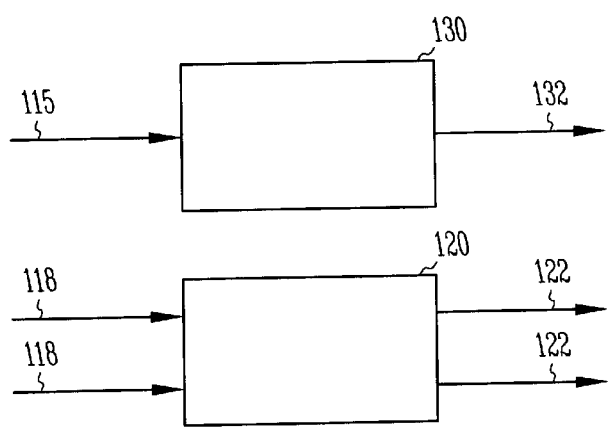

FIG. 1 is a high-level block diagram of a signal deskewing circuit 100 used to reduce skew between signals. Such a deskewing circuit is described in SYSTEM AND METHOD FOR ADAPTIVELY DESKEWING PARALLEL DATA SIGNALS RELATIVE TO A CLOCK, U.S. patent application Ser. No. Xx/yyy,yyy, filed herewith.

As shown in FIG. 1, signal deskewing circuit 100 receives two or more data signals 105 and a channel clock 115 from another device and removes skew between the two or more data signals to create deskewed data signals 116. In one embodiment, signal deskewing circuit 100 includes two or more data capture circuits 110, a delay line controller 120 and a channel clock interface 130. Each data capture circuit 110 includes a delay line 112 and a skew detection circuit 114 connected to delay line 112. Delay line controller 120 is connected to each delay line 112 and each skew detection circuit 114. Delay line controller 120 receives skew indicator signals 118 representing skew from each of the skew detection circuits 114 and controls the delay added by each of the delay lines 112 via control 122. In one embodiment, channel clock interface 130 receives channel clock 115, doubles its frequency to form doubled channel clock 132 and drives each skew detection circuit 114 with doubled channel clock 132.

Figure 2:
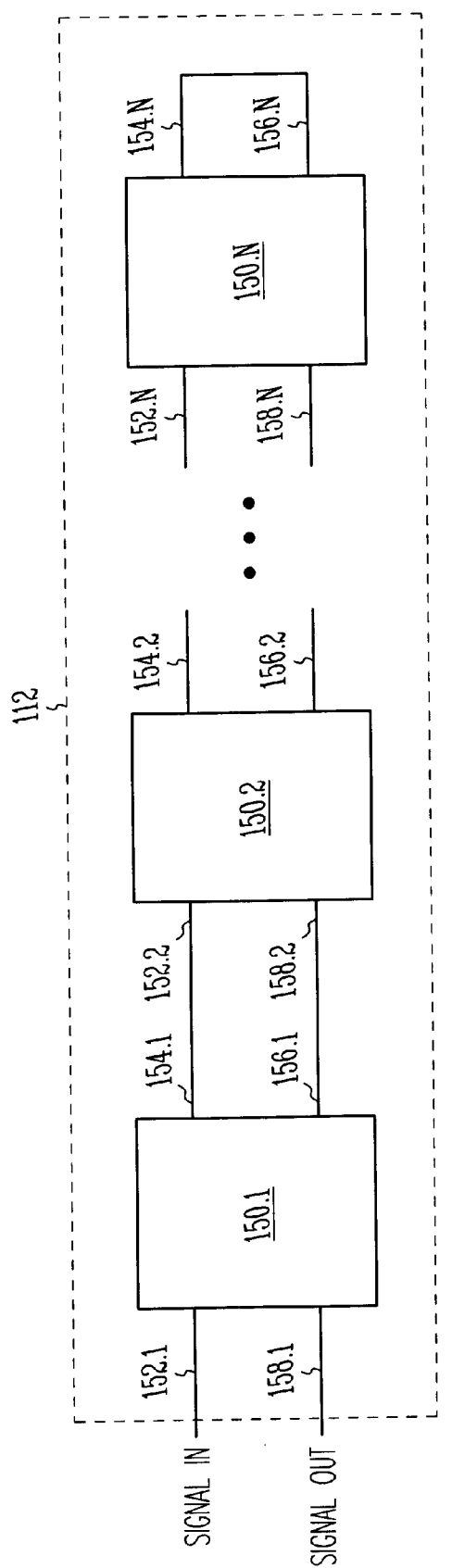
FIG. 2 is a high-level schematic illustration of a thermometer encoding device according to the teachings of this application.

A delay line 112 which can be used in signal deskewing circuit 100 is shown in FIG. 2. Delay line 112 includes one or more delay subcircuits 150. Each delay subcircuit 150 includes forward input 152, forward output 154, return input 156 and return output 158. In one embodiment, as is shown in FIG. 2, delay subcircuits 150.1 through 150.N are wired together such that a forward input 152 is connected to an adjacent forward output 154, and a return input 156 is connected to an adjacent return output 158. (For instance, in the embodiment shown in FIG. 2, forward input 152.2 is connected to forward output 154.1 and return input 156.1 is connected to return output 158.2.)

Delay line 112 can also be used within channel clock interface 130 to reduce skew between channel clock 115 and each of the data signals 105.

Figure 3:
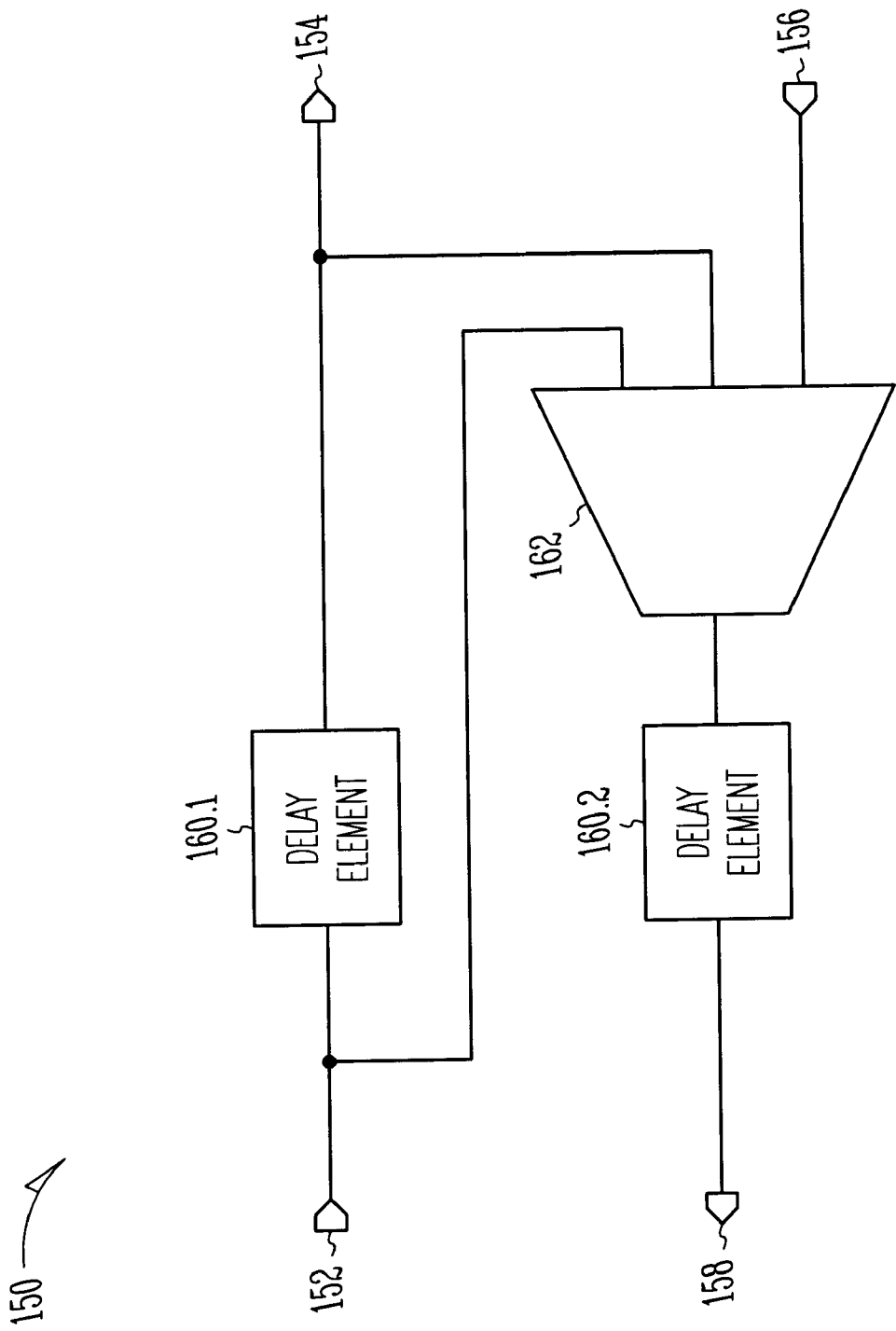
FIG. 3 is an illustration of a schematic of a pass gate that can be implemented in one embodiment of the present invention.

In one embodiment, each subcircuit 150 includes two delay elements (160.1 and 160.2) and a 3 to 1 multiplexer 162. One such embodiment is shown in FIG. 3. In the embodiment shown in FIG. 3, forward input 152 is connected to delay element 160.1 and to an input of 3 to 1 multiplexer 162. The output of the first delay element 160.1 is connected to forward output 154 and to a second input of multiplexer 162. Return input 156 is connected to the third input of multiplexer 162.

p In the embodiment shown in FIG. 3, the output of multiplexer 162 is connected to delay element 160.2. The output of delay element 160.2 is connected in turn to return output 158. Delay subcircuit 150 of FIG. 3 can, therefore, add one or two delays to a signal arriving at forward input 152.

Figure 4:
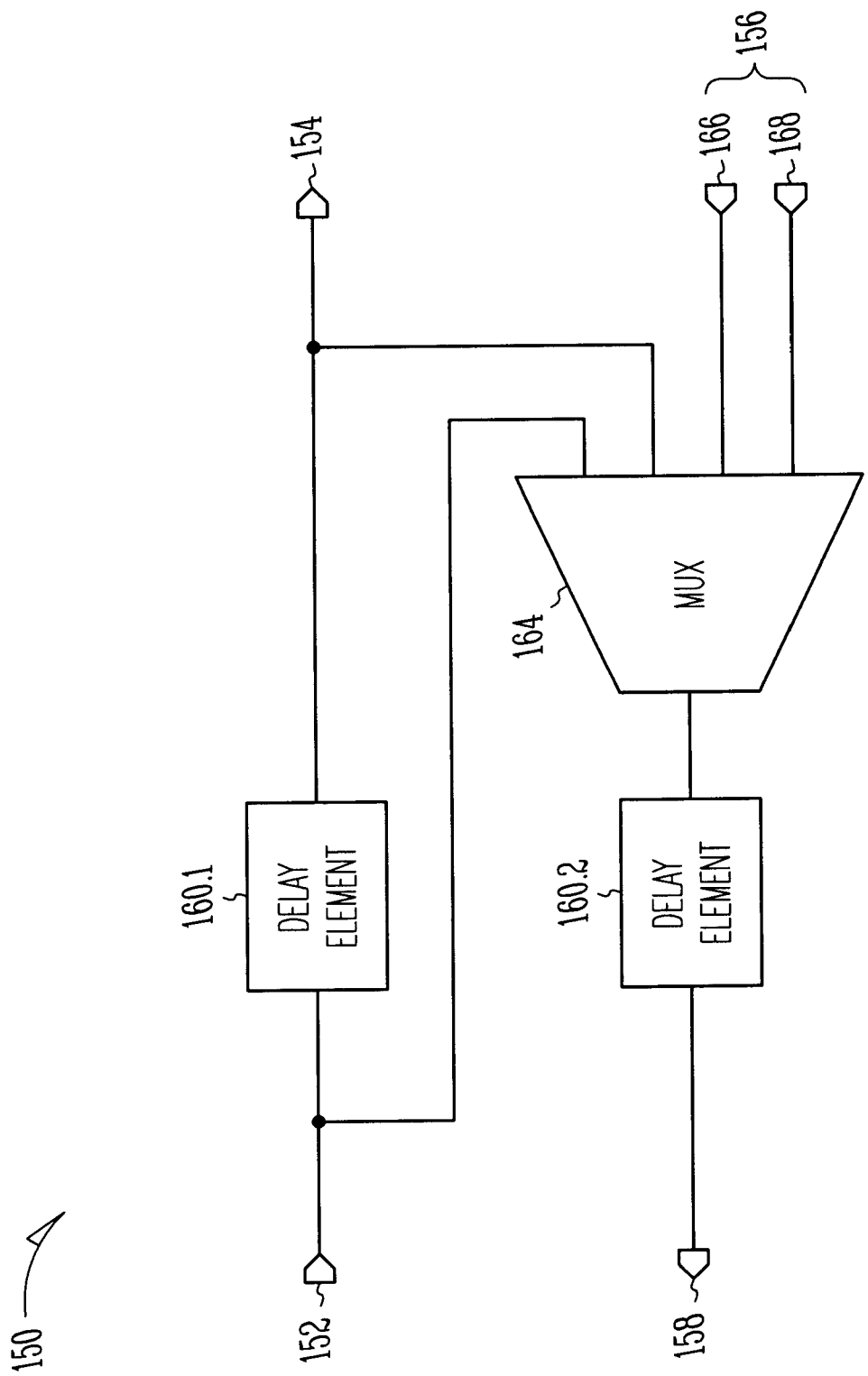
FIG. 4 is an illustration of a schematic of a 4-to-1 multiplexor that can be implemented in one embodiment of the present invention.

In one embodiment, each subcircuit 150 includes two delay elements (160.1 and 160.2) and a 4 to 1 multiplexer 164. One such embodiment is shown in FIG. 4. In the embodiment shown in FIG. 4, forward input 152 is connected to delay element 160.1 and to an input of 4 to 1 multiplexer 164. The output of the first delay element 160.1 is connected to forward output 154 and to a second input of multiplexer 164.

In the embodiment shown in FIG. 4, return input 156 is actually two signal lines (166 and 168). Return input 166 is connected to a third input of multiplexer 164. Return input 168 is connected to a fourth input of multiplexer 164.

In the embodiment shown in FIG. 4, the output of multiplexer 164 is connected to delay element 160.2. The output of delay element 160.2 is connected in turn to return output 158. Delay subcircuit 150 of FIG. 4 can, therefore, add one or two delays to a signal arriving at forward input 152.

Figure 5:
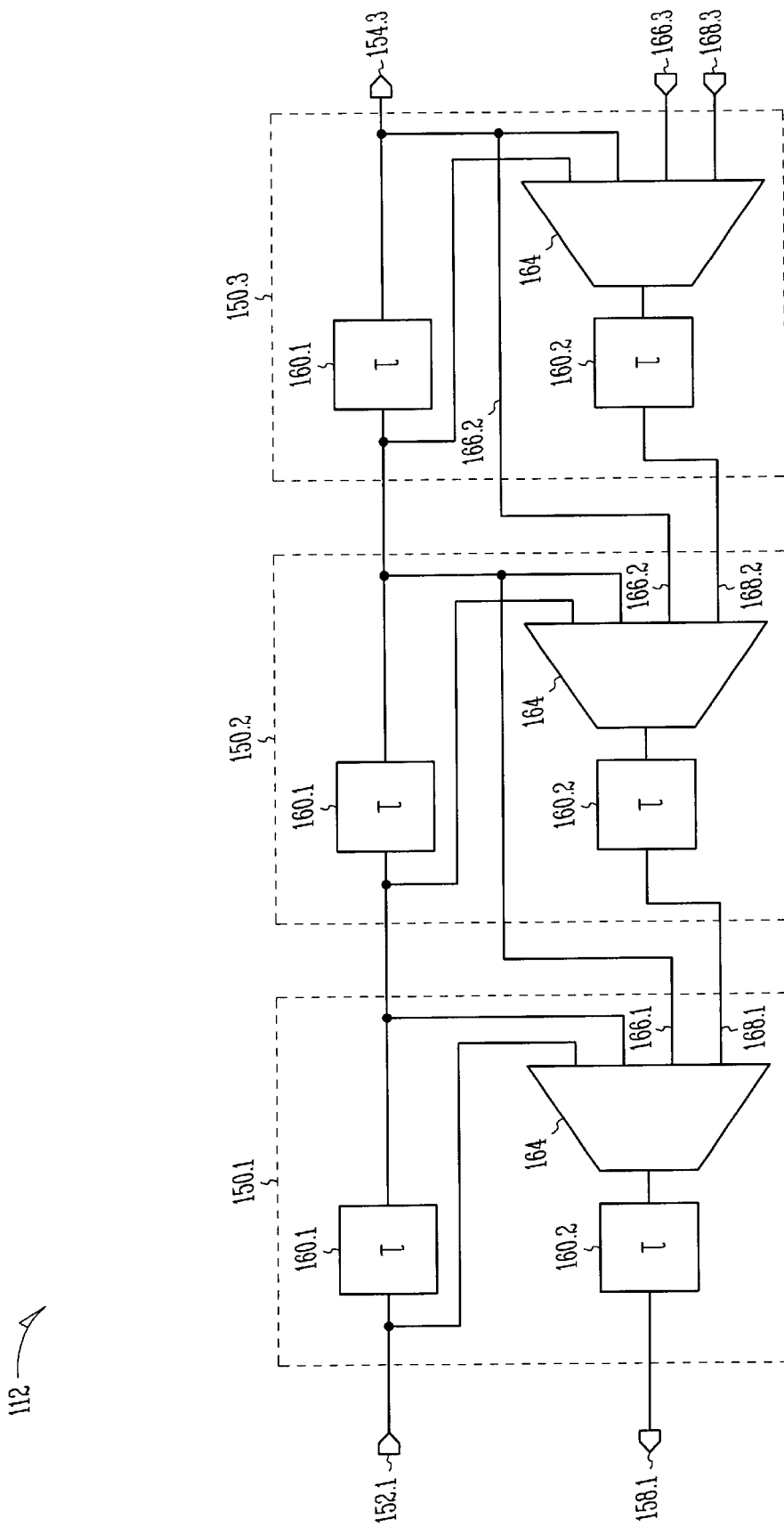
FIG. 5 is a simplified illustration of a delay chain according to the teachings of the present invention.

One embodiment of a delay line 112 based in delay subcircuit of FIG. 4 is shown in FIG. 5. In the embodiment shown in FIG. 5 forward outputs 154 are fed back into inputs of multiplexers 164 through signal line 166. Such an approach provides two feedback paths for propagating a delayed data signal. The advantages of such an approach are discussed below.

Figure 6:
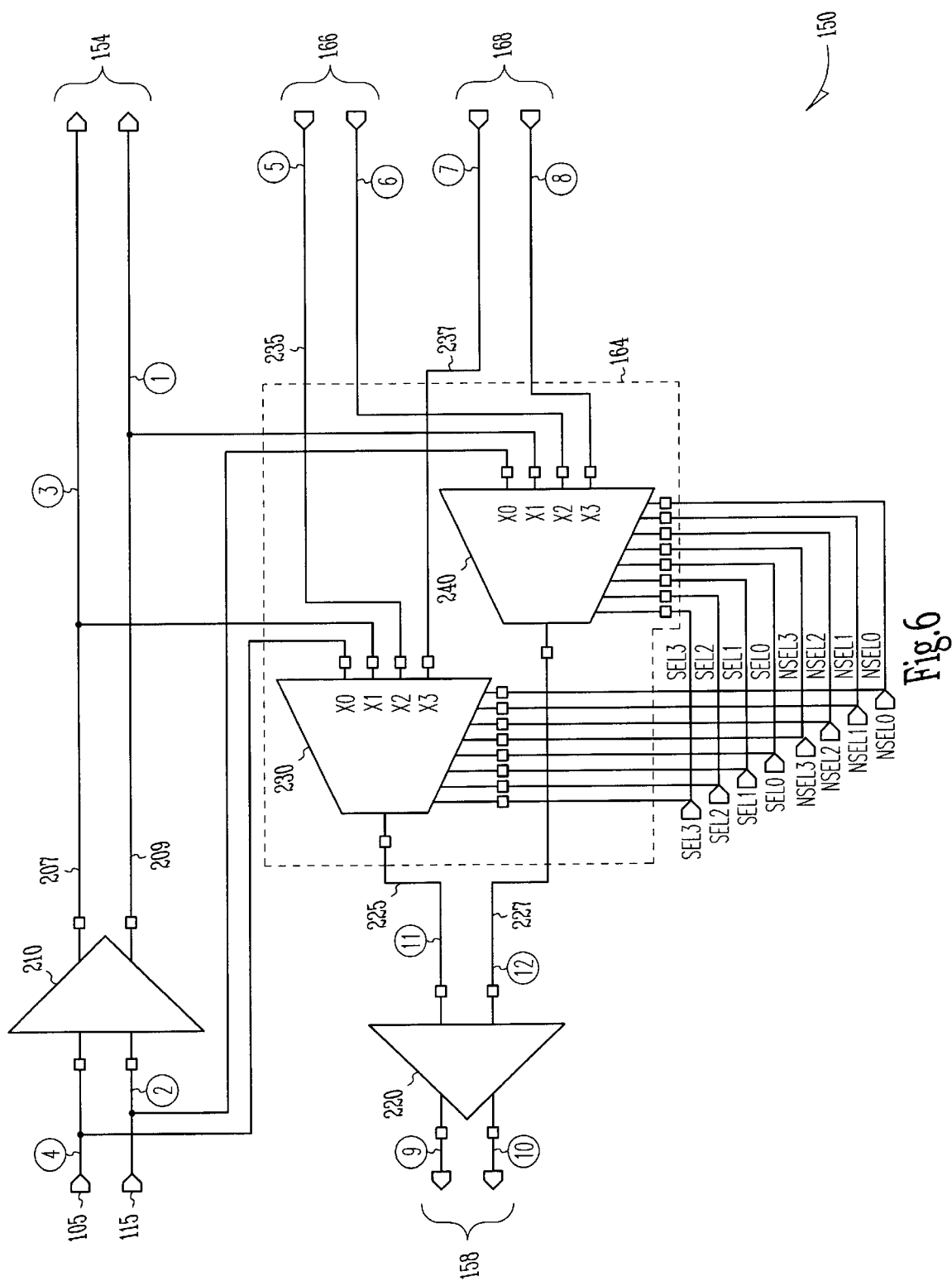
FIG. 6 is a simplified illustration of a delay chain coupled to a thermometer encoding device according to the present invention.

A differential signal approach will be discussed next. In one embodiment, each of the signal lines is differential. One such embodiment is shown in FIG. 6. In one such embodiment 4-to-1 multiplexer 164 is replaced by a multiplexer pair (230 and 240). Delay elements 210 and 220 are also differential. (It should be understood that each subcircuit 150 could be driven by either single-ended or differential signals, and that differential signals do not have to be used within subcircuit 150.)

In the differential embodiment shown, a differential data or clock signal 205 is transmitted to the first delay element 210 and a second signal 215 is also sent to the delay element 210. The first delay element 210 adds a predetermined amount of delay to both the 205 and the 215 signal, creating delayed signals 207 and 209, respectively. Delayed signal 207 is routed to external circuitry and to the first multiplexor 230, where it is latched. Delayed signal 209 is routed to external circuitry and to the second multiplexor 240.

First multiplexor 230 receives two external signals, 235 and 237, respectively. The second multiplexor 240 receives two external signals, 245 and 247, respectively. In the embodiment shown multiplexor selection control lines (SEL3-0 and NSEL3-0) are used to select the signal to be transmitted on outputs 225 and 227 of multiplexors 230 and 240, respectively, allowing corresponding signals to be selected and transmitted in parallel. Second delay element 220 adds a predetermined amount of delay to signals on outputs 225 and 227 and transmits them both to external circuitry.

Design considerations will drive whether a 3 to 1 multiplexor such as multiplexor 162 or a 4 to 1 multiplexor such as multiplexors 164, 230 and 240 should be used. For a given circuit the technology it is designed in has a large impact on the performance limitations. For the differential delay circuitry an important characteristic is the minimum increment in delay size. With three inputs to the MUX the step size may be too large, which would negatively impact the bit error rate of the channel it is to be used in. If, for instance, the minimum required step size is defined by propagation from 152 to 154 through delay element 160 or 210, it is very difficult to design the path from 168 through 158 to introduce a delay less than or equal to the minimum step size.

In one embodiment, the path from a MUX input to output 158 is the minimum overall propagation delay. The minimum latency through a chain of these circuits 150 is from the inputs 152 of the first cell (150.1), through the MUX and out output 158 of the first cell (150.1). This delay is $=_M+_D$. where $_M$ is the delay through the multiplexor and D is the delay through delay element 160.2. (In the following discussion, we'll assume that the delay added by each of the delay elements 160 is equal to $_D$ and that the delay added by each multiplexor is equal to $_M$.)

To add a little bit more delay, the path through delay element 160.1 and multiplexer 162 or 164 is selected. This means that the cumulative delay includes the delay introduced by delay element 160.1 (i.e., the minimum step size is added to the previously calculated delay). The delay added by this path is $=_M+_D+_D$.

In the case of the 3 to 1 multiplexor 162, additional delay is added by propagating a signal through delay element 160.1 of circuit 150.1, through multiplexor 162 of circuit 150.2, through delay element 160.2 of circuit 150.2, through multiplexor 162 of circuit 150.1 and through delay element 160.2 of circuit 150.1. The end result is a delay which includes the delays introduced by three delay elements and two multiplexors, or $=_M+_D+_D+_M+_D$ The difference in delay between the two paths is, therefore $_M+_D$.

The delay introduced by multiplexor 162 can be significant and technology limitations may make it difficult to speed up the path through MUX 162. In the differential embodiment, attempts to speed up the path may introduce skew between the true and compliment inputs of our differential signal. This is unacceptable.

It is possible, however, to optimize the delay through the MUX and differential circuitry in the return path so that it is twice the minimum acceptable delay or twice the delay through the forward path (which represents the minimum delay increment in the cell). This in combination with inputs 166 allow us to reach our minimum step size requirement. If the delay added going through a forward path is D and the delay going through a return path is 2D the increment progression is as follows:

| | |
|---|---|
| 1) Delay = 2D: | path from input 152 through multiplexor 164 to output 158 |
| 2) Delay = 3D: | path from input 152 through delay 160 through multiplexor 164 to output 158 |
| 3) Delay = 4D: | path from input 152 through delay element 160.1 of 150.1, through delay element 160.1 of 150.2, through multiplexor 164 to output 158 |
| 3) Delay = 5D: | path from input 152 through delay element 160.1 of 150.1, through multiplexor 164 of 150.2, through multiplexor 164 of 150.1 to output 158 |

This progression can be carried on for an arbitrary number of delay increments of D. The minimum propagation is only 2D. The input and output signals are always from the same physical location which is good for physical design flow.

Figure 7:
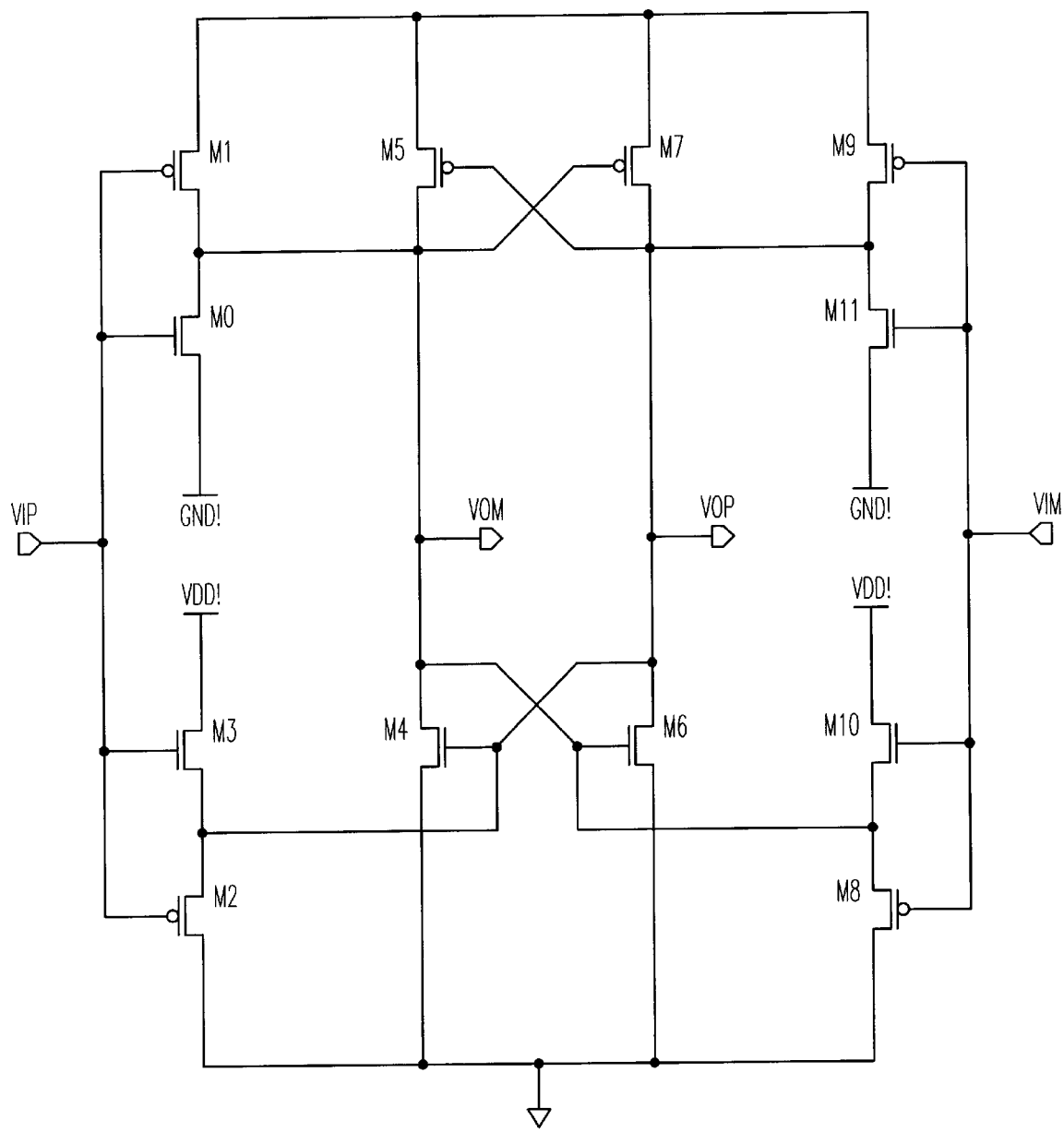
FIG. 7 is a detailed schematic of a differential MUX control circuit.

One embodiment of a delay element 160 is shown in FIG. 7. In the embodiment shown in FIG. 7, each delay element 160 includes a plurality of input and output nodes, including a first and second input node and a first and second output node and further includes transistors operatively coupled as shown in FIG. 7. The particular delay element, shown in FIG. 7, is configured with a first NMOS transistor, wherein a source region is coupled for ground, and a second PMOS transistor, wherein a source region of a second transistor is coupled to drain region of a first transistor. The delay element can further include a third PMOS transistor, where a gate region is coupled to a second input node, wherein a drain region is coupled to ground. A fourth NMOS transistor, where a drain region of a fourth transistor is coupled to a source region of a fourth transistor is coupled to the drain of a third transistor. The gate of a fourth transistor is further coupled to a gate of a third, a first and a second transistor. A fifth NMOS transistor, where a drain region of a fifth transistor is coupled to a first output node. The source region of a fifth transistor is coupled to ground and wherein a gate region is coupled to a second output node and the source region of a fourth transistor. A sixth PMOS transistor, wherein a source region is coupled to a source region of a second transistor, wherein drain region is coupled to a drain region of second transistor and a first output node, and a seventh NMOS transistor, where a drain region is coupled to a second output node, wherein a gate region is coupled to a drain region is coupled to a drain region of a fifth transistor and wherein a source region is coupled to ground. An eighth PMOS transistor, where a source region is coupled to a source region of a sixth transistor. The drain region is coupled to a gate region of a sixth transistor and a second output node, and wherein a gate region is coupled to a drain region of a sixth transistor. A ninth PMOS transistor, where a source region is coupled to a gate region of a seventh transistor, a drain region is coupled to ground and wherein a gate region is further coupled to a first input node. A tenth PMOS transistor, where a source region is coupled to a source region of a eighth transistor. The drain region is coupled to the drain region of a eighth transistor and wherein gate region is coupled to a first signal node. An eleventh NMOS transistor, where a drain region is coupled to a bias voltage, a source region is coupled to a source region is coupled to a source region of a ninth transistor and wherein a gate region is further coupled to a first input node. A twelfth NMOS transistor, where a source region is coupled to ground, a drain region is coupled to a drain region of a tenth transistor and the gate region is coupled to a first input node.

Figure 8:
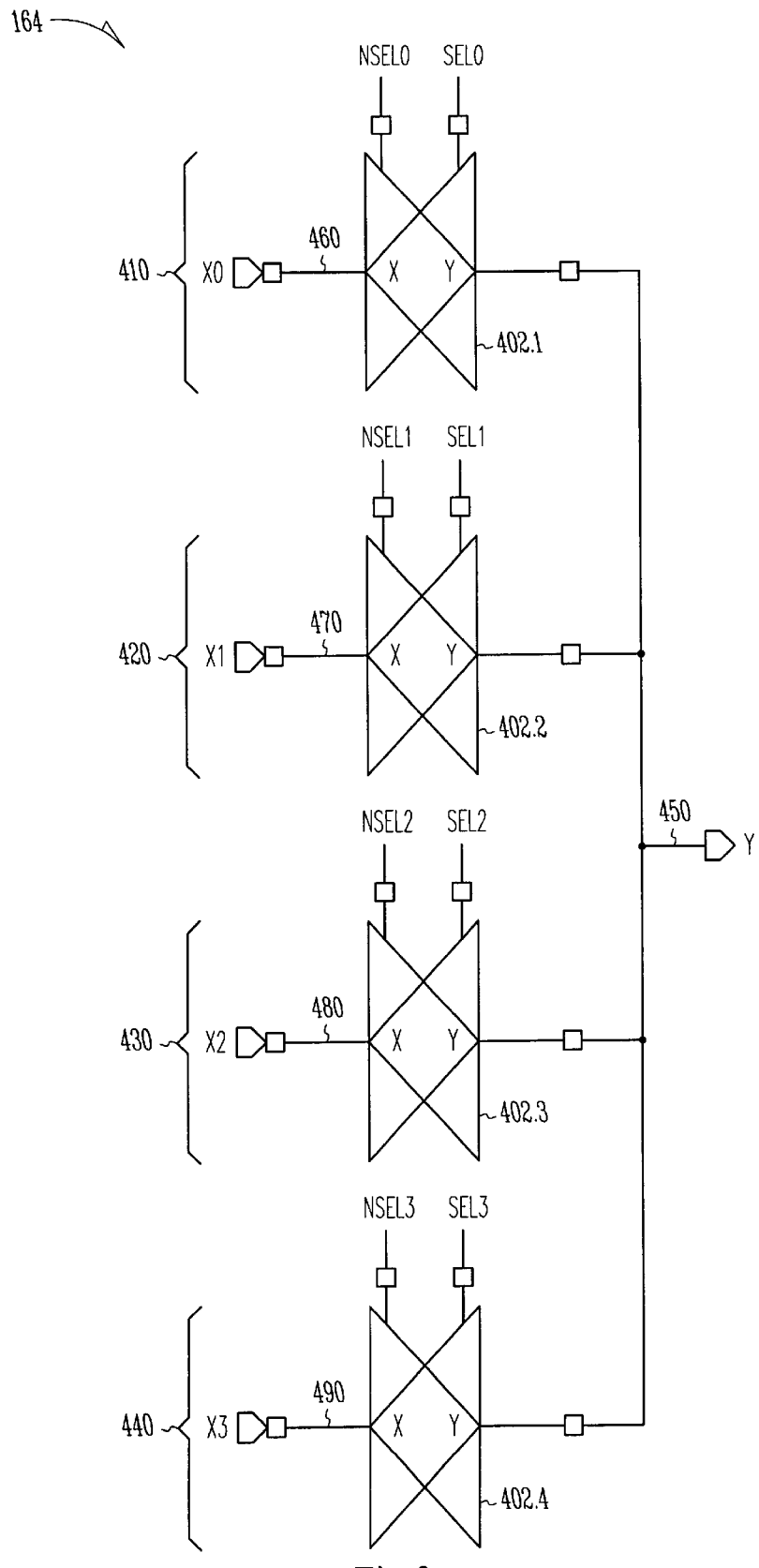
FIG. 8 is an illustration of a delay element according to the teachings of the present invention.

FIG. 8 is a detailed schematic of one embodiment of multiplexer 164. In the embodiment shown in FIG. 8, four pass gates 402 operate under control of selection control lines SEL3-0 and NSEL3-0.

Figure 9:
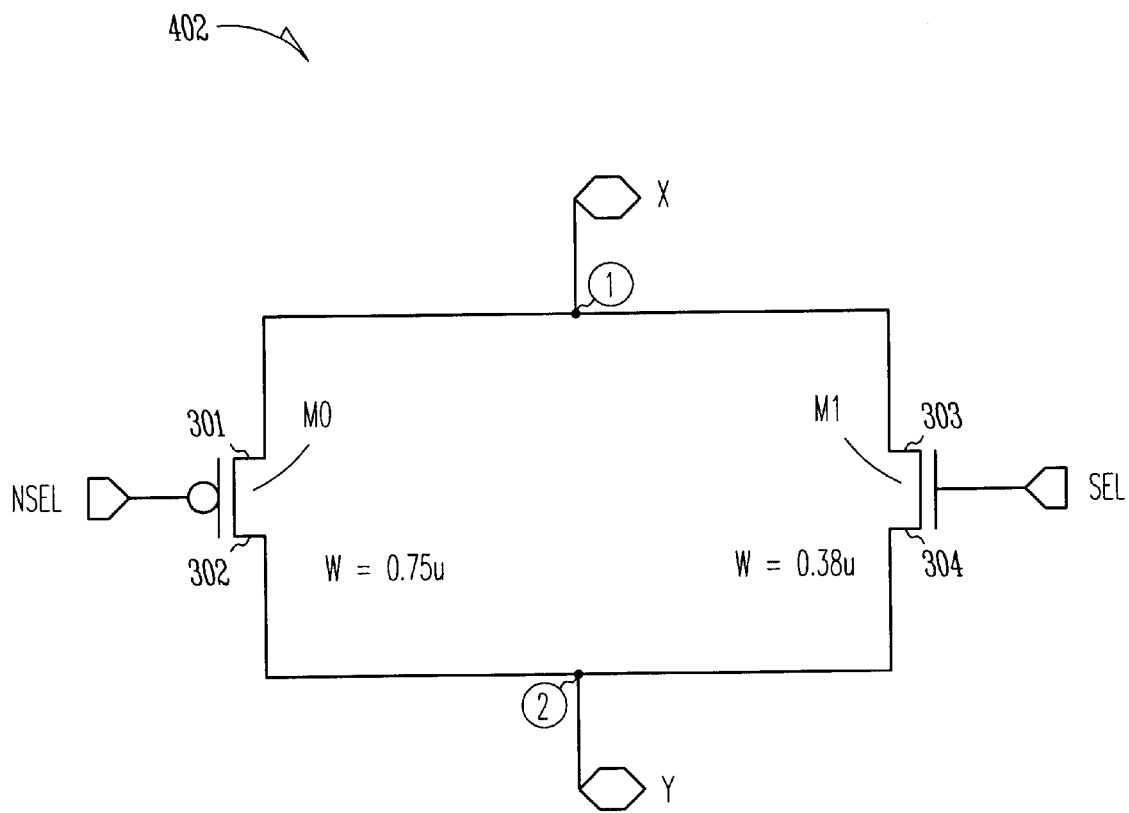
FIG. 9 is an illustration of a representative pass gate device.

A representative pass gate 402 is shown in FIG. 9. Pass gate 402 includes an n-channel metal oxide semiconductor transistor (NMOS) M1 and a p-channel metal oxide semiconductor transistor M0. The drain region, 303, of the NMOS transistor M1 is coupled to the source region, 301, of the p-channel metal oxide semiconductor (PMOS) transistor M0. The source region, 304, of the NMOS transistor is coupled to the drain region, 302, of the PMOS transistor. Node 1 is connected to both the drain region 303 of M1 and the source region 301 of M0. Node 2 is connected to both the source region 304 of M1 and the drain region 302 of M0. There is a select signal (SEL) driving the gate region of M1 and a second select signal (NSEL) is driving the gate region of M0. When SEL is high, turning the M1 "on", and if NSEL is a low, turning on M0, then a signal applied to node1 will be "passed" through and be transmitted through node 2.

Figure 10:
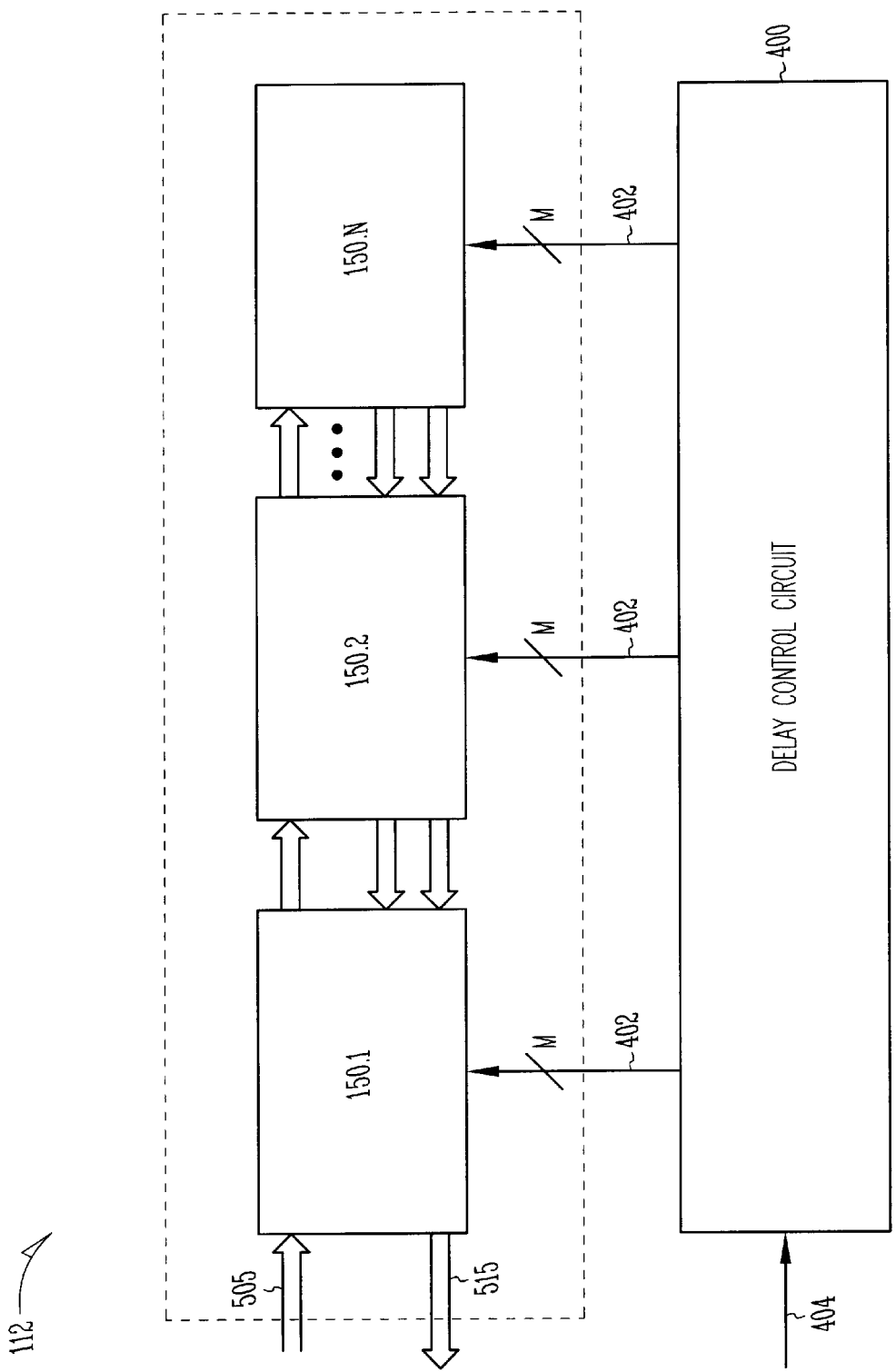
FIG. 10 is an illustration of a system for controlling the amount of delay added to a signal through a delay line.

FIG. 10 illustrates one mechanism which can be used to control the amount of delay added to a signal through delay line 112. In the embodiment shown in FIG. 10, delay line 112 includes a delay control circuit 400 and N delay subcircuits 150. Delay control circuit 400 includes M*N select lines 402 used to control delay subcircuits 150 and a delay control input 404 used to control select lines 402. In one embodiment, the N delay subcircuits 150 are connected as in FIG. 5. A data or clock signal arriving at signal input 505 is propagated through delay line 112 as a function of the M select lines 402 connected from control circuit 400 to subcircuits 150. In one embodiment, delay subcircuit 150 includes a 3 to 1 multiplexer as is shown in FIG. 3. Enough information must, therefore, be transmitted on each the select lines 402 routed to each subcircuit 150 to select one of the three inputs to the 3 to 1 multiplexer. In another embodiment, delay subcircuit 150 includes a 4 to 1 multiplexer as is shown in FIGS. 4 through 6. Enough information must, therefore, be transmitted on each the select lines 402 routed to each subcircuit 150 to select one of the four inputs to the 4 to 1 multiplexer.

In one differential signal embodiment, such as is shown in FIG. 6, M equals eight. That is, eight select lines 402 (SEL3-0 and NSEL3-0) are routed from control circuit 400 to each of the subcircuits 150. The NSEL lines are the complement of the SEL lines.

In one embodiment, delay control circuit 400 includes a delay variable register used to hold a delay variable. In such an embodiment, delay control circuit 400 also includes a decoder used to decode select lines 402 from the contents of the delay variable register.

In another embodiment, the state of each of the select lines 402 is written to and latched within control circuit 400.

Figure 11:
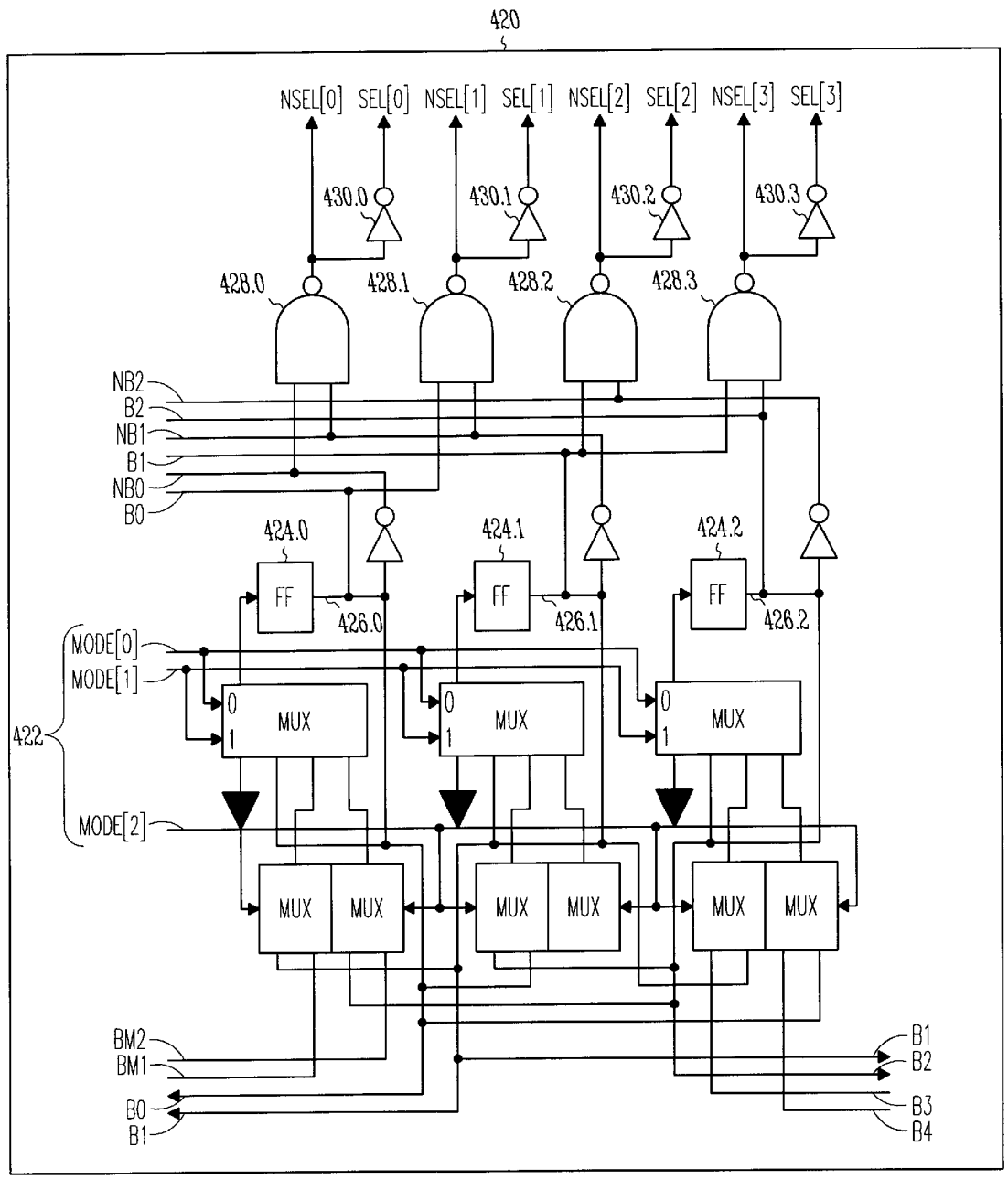
FIG. 11 is a detailed schematic of a block which controls one stage of a delay chain.

In yet another embodiment, control circuit 400 includes a thermometer encoding device such as is shown in FIG. 11. In the embodiment shown in FIG. 11, control circuit 400 includes N control cells 420. Each control cell 420 sources the select lines 402 for its associated subcircuit 150. A differential signal embodiment is shown in FIG. 11 but the concept could be applied as well to circuits using only single ended signals.

In the embodiment shown in FIG. 11, when a select line is high the corresponding differential inputs of the delay line are propagated through the circuitry. Therefore, when SEL0 is high, the least amount of delay is added by delay subcircuit 150 and when SEL3 is high, the greatest amount of delay is added by delay subcircuit 150.

In one embodiment, mode signals 422 are common to all of the control cells 420. In one embodiment, mode signals 422 control the data latched into flip flops 424. The outputs 426 of the flip flops 424 are connected to NAND gates 428 in order to form NSEL3-0. SEL3-0 is then formed from NSEL3-0, respectively by running each signal through an inverter 430.

In one embodiment, depending on the value of the mode signal 422, the data in flip flops 424 can shift left by one, shift left by 2, shift right by one, shift right by 2, hold or zero all flip flops in the circuitry. At initialization all flip-flops can be set to zero except the left most bit which is set high. Implementing a thermometer encoding device in this manner guarantees a solid stream of logical highs are shifted through the control circuitry in thermometer code fashion. To the left of some point is all logical highs in the flip flops while to the right of that point are all logical lows.

Figure 12:
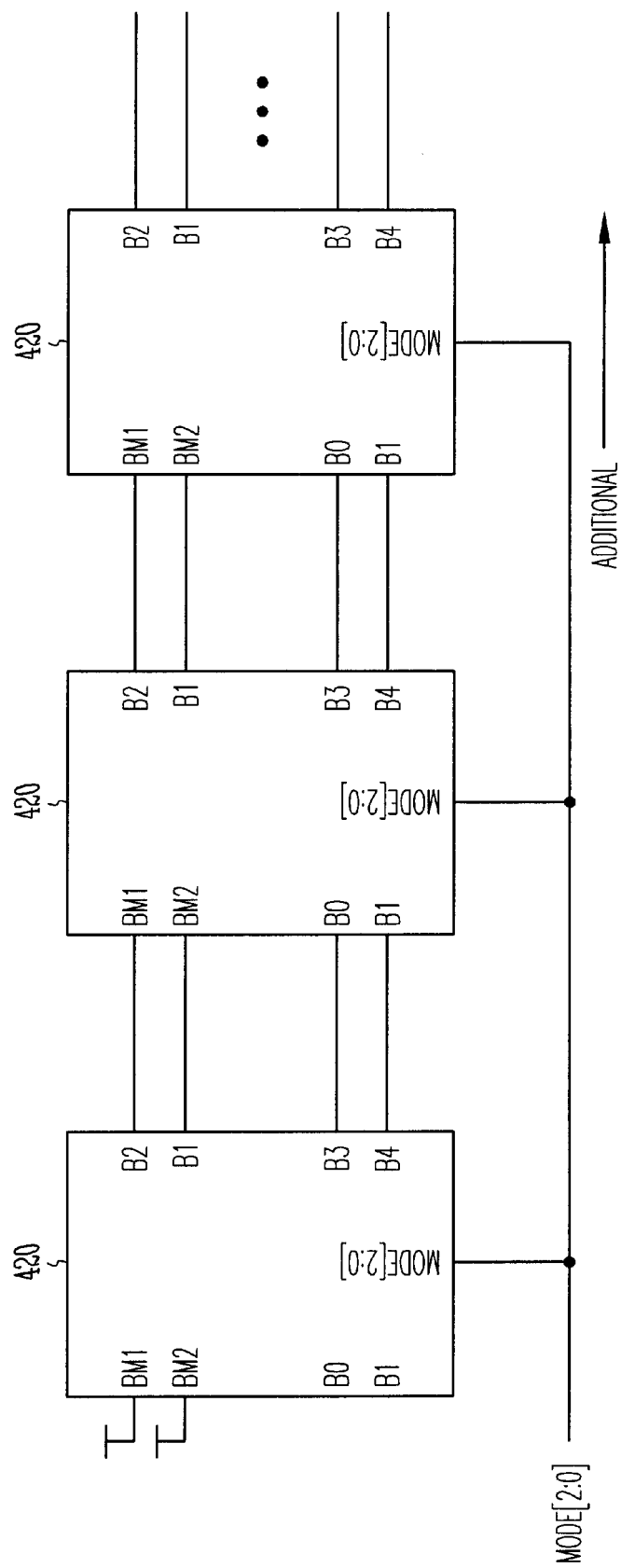
FIG. 12 is an illustration of how control blocks (420) may be cascaded together to control an entire delay line chain.

FIG. 12 shows how multiple control cells 420, can be cascaded together to control an entire delay line chain.

Conclusion

Thus, novel structures and methods for reducing the skew on signals transmitted between electrical components while reducing both engineering and material costs related to achieving low skew occurrence in data signals has been described.

A mechanism to provide fine resolution delay increments for differential signals was required. In addition it was desirable for the resulting circuit to perform duty cycle correction on the differential signals, to provide some amount of test coverage and to minimize the physical design process. The resolution of the delay increment was to be on the order of fifty picoseconds.

The delay chain is comprised of a number of identical subcircuits. Each subcircuit has a forward input, forward output, return input and a return output. The subcircuits are wired together such that a forward input is wired to an adjacent forward output, a return input is wired to an adjacent return output. In one embodiment of the present invention, each subcircuit is comprised of two delay elements and a 4 to 1 multiplexer. One of the delay elements is wired between the forward input and forward output. The remaining element is wired between the output of the multiplexer and the return output. The multiplexer controls connects either the forward input, forward output, forward output of the next delay stage or the return output to the input of the second delay element. In practice the delay through the multiplexer is twice the delay through the delay element. This allows the delay increment to be equal to the delay through a delay element.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A delay element, comprising:

a plurality of input and output nodes, including a first and second input node and a first and second output note;

a first NMOS transistor, wherein a source region is coupled for ground;

a second PMOS transistor, wherein a source region of a second transistor is coupled to drain region of a first transistor;

a third PMOS transistor, wherein a gate region is coupled to a second input node, wherein a drain region is coupled to ground;

a fourth NMOS transistor, wherein a drain region of a fourth transistor is coupled to a source region of a fourth transistor is coupled to the drain of a third transistor, wherein a gate of a fourth transistor is further coupled to a gate of a third, a first and a second transistors;

a fifth NMOS transistor, wherein a drain region of a fifth transistor is coupled to a first output node, wherein a source region of a fifth transistor is coupled to ground and wherein a gate region is coupled to a second output node and the source region of a fourth transistor;

a sixth PMOS transistor, wherein a source region is coupled to a source region of a second transistor, wherein drain region is coupled to a drain region of second transistor and a first output node;

a seventh NMOS transistor, wherein a drain region is coupled to a second output node, wherein a gate region is coupled to a drain region is coupled to a drain region of a fifth transistor and wherein a source region is coupled to ground;

an eighth PMOS transistor, wherein a source region is coupled to a source region of a sixth transistor, wherein the drain region is coupled to a gate region of a sixth transistor and a second output node, and wherein a gate region is coupled to a drain region of a sixth transistor;

a ninth PMOS transistor, wherein a source region is coupled to a gate region of a seventh transistor, a drain region is coupled to ground and wherein a gate region is further coupled to a first input node;

a tenth PMOS transistor, wherein a source region is coupled to a source region of a eighth transistor, wherein a drain region is coupled to the drain region of a eighth transistor and wherein gate region is coupled to a first signal input node;

an eleventh NMOS transistor, wherein a drain region is coupled to a bias voltage, a source region is coupled to a source region of a ninth transistor and wherein a gate region is further coupled to a first input node; and a twelfth NMOS transistor, wherein a source region is coupled to ground, a drain region is coupled to a drain region of a tenth transistor and wherein a gate region is coupled to a first input node.

2. The delay element of claim 1, wherein the first and the twelfth transistors are 2.04 microns wide.

3. The delay element of claim 1, wherein the sixth and the eighth transistors are 1.22 microns wide.

4. The delay element of claim 1, wherein the second and the tenth transistors are 4.52 microns wide.

5. The delay element of claim 1, wherein the fourth and the eleventh transistors are 1.14 microns wide.

6. The delay element of claim 1, wherein the fifth and the seventh transistors are 0.32 microns wide.

7. The delay element of claim 1, wherein the third and the ninth transistors are 2.02 microns wide.

* * * * *

UNITED STATES PATENT AND TRADEMARK OFFICE
CERTIFICATE OF CORRECTION

PATENT NO.    : 6,486,723 B1
DATED         : November 26, 2002
INVENTOR(S)   : DeRyckere et al.

It is certified that error appears in the above-identified patent and that said Letters Patent is hereby corrected as shown below:

Column 8,
Line 20, delete "note" and insert -- node --, therefor.

Signed and Sealed this

First Day of July, 2003

JAMES E. ROGAN
*Director of the United States Patent and Trademark Office*